United States Patent
Kim et al.

(10) Patent No.: US 7,543,264 B2
(45) Date of Patent: Jun. 2, 2009

(54) HIGH FREQUENCY SIGNAL TRANSMISSION LINE HAVING GROUND LINE BLOCKS TO REDUCE NOISE

(75) Inventors: Young Woo Kim, Chungcheongnam-do (KR); Chang Myung Ryu, Gyeonggi-do (KR); Han Kim, Daejeon (KR); Woo Lim Chae, Chungcheongnam-do (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 600 days.

(21) Appl. No.: 11/222,398

(22) Filed: Sep. 7, 2005

(65) Prior Publication Data

US 2006/0146484 A1     Jul. 6, 2006

(30) Foreign Application Priority Data

Dec. 30, 2004  (KR) .................. 10-2004-0116802

(51) Int. Cl.
*G06F 17/50* (2006.01)
*H02H 7/00* (2006.01)

(52) U.S. Cl. ....................... 716/15; 361/107
(58) Field of Classification Search .................. 716/15; 361/107

See application file for complete search history.

(56) References Cited

U.S. PATENT DOCUMENTS

| | | | |
|---|---|---|---|
| 5,592,391 A * | 1/1997 | Muyshondt et al. | 716/15 |
| 5,729,183 A * | 3/1998 | Schuchmann et al. | 333/1 |
| 7,372,143 B2 * | 5/2008 | Nakamura et al. | 257/698 |
| 2005/0251770 A1 * | 11/2005 | Frank et al. | 716/5 |

FOREIGN PATENT DOCUMENTS

| | | |
|---|---|---|
| JP | 5-86859 | 12/1993 |
| JP | 08-242078 | 9/1996 |
| JP | 11-214810 A | 8/1999 |
| JP | 11-220056 A | 8/1999 |
| KR | 1999-0044871 | 6/1999 |

OTHER PUBLICATIONS

Heesok Lee, et al., Effect of Ground Guard Fence with Via and Ground Slot on Radiated Emission in Multi-Layer Digital Printed Circuit Board, IEEE, 2001, pp. 653-656.

* cited by examiner

*Primary Examiner*—Stacy A Whitmore
(74) *Attorney, Agent, or Firm*—Darby & Darby P.C.

(57) ABSTRACT

A high frequency signal transmission line having reduced noise. Particularly, a signal transmission line of the current invention has reduced radiation noise and reflection noise, because a conventional ground guard fence line disposed between signal lines is separated into a plurality of ground line blocks that are spaced apart from each other to shield against noise.

6 Claims, 2 Drawing Sheets

HIGH FREQUENCY SIGNAL TRANSMISSION LINE HAVING GROUND LINE BLOCKS TO REDUCE NOISE

INCORPORATION BY REFERENCE

The present application claims priority under 35 U.S.C. §119 to Korean Patent Application No. 10-2004-0116802 filed on Dec. 30, 2004. The content of the application is incorporated herein by reference in its entirety.

BACKGROUND OF THE INVENTION

1. Field of the Invention

The present invention relates, generally, to a high frequency signal transmission line having reduced noise. More particularly, the present invention relates to a signal transmission line having reduced radiation noise and reflection noise, by separating a conventional ground guard fence line disposed between signal lines into a plurality of ground line blocks that are spaced apart from each other to shield against noise.

2. Description of the Related Art

In general, high frequency signal transmission and high-speed switching of chips of electronic systems cause undesired noise due to electromagnetic interference. Particularly, a printed circuit board (PCB) for high frequency packages, which must have a high density circuit design, requires a predetermined wire length, and also, has wires transmitting a high frequency signal and wires transmitting a low frequency signal designed to be adjacent to each other. Thus, it is difficult to transmit the signal due to crosstalk noise generated by the two kinds of wires.

Noise generated upon signal transmission through microstrips of the PCB includes, for example, crosstalk noise, reflection noise, and radiation noise.

Crosstalk noise is generated by capacitive coupling and inductive coupling between two transmission lines constituting signal lines, and the magnitude thereof depends on the methods of designing transmission lines, insulating media and degree of impedance matching.

Also, crosstalk noise is divided into near-end crosstalk noise and far-end crosstalk noise.

Near-end crosstalk noise causes noise on the line adjacent to the high frequency line at the same time as a signal is transmitted from the signal-applied portion of the high frequency line to the far end thereof, and occurs when a signal is returned from the far end of the high frequency line to the signal-applied portion thereof.

Far-end crosstalk noise occurs when the signal is transmitted to the far end of the line. Although far-end crosstalk noise has a much smaller signal width than near-end crosstalk noise, it has a large magnitude, thus causing incorrect switching operation.

Further, reflection noise is generated upon mismatching of characteristic impedance or terminating resistance between the high frequency signal transmission line and the line adjacent to the transmission line. Reflection noise generated at the far end of the transmission line affects the near-end crosstalk noise. Hence, it is important to minimize not only reflection noise but also crosstalk noise that results from reflection noise.

Further, radiation noise is generated by a closed loop while the signal is transmitted along the closed loop that is formed in the signal transmission line.

In a conventional high density wire design to minimize crosstalk noise, a method of disposing a ground guard fence line (GGFL) between a high frequency signal line and a line adjacent to the signal line, and a structure having via holes formed through the GGFL have been used.

FIG. 1 is a perspective view showing the structure of a conventional high density wire design, composed of signal lines 11 and GGFLs 12 disposed between the signal lines 11 to minimize noise. FIG. 2 is a sectional view taken along the line A-A' of FIG. 1, showing the GGFL 12, the via holes 13 and ground electrodes 14a and 14b.

The via holes 13 are formed at regular intervals through the GGFL 12, and the ground electrodes 14a and 14b formed on upper and lower surfaces, respectively, of the GGFL 12 are connected to each other by means of the via holes 13.

As in FIG. 1, the conventional structure, which includes the signal lines 11, the GGFLs 12 disposed between the signal lines 11, and the via holes 13 formed at regular intervals through the GGFL 12, is designed so that the emission energy radiated from the signal line 11 is shielded by the GGFL 12.

However, all of the conventional structure shown in FIGS. 1 and 2, as well as other conventional structures, consider nothing but crosstalk noise, and do not consider reflection noise.

Thus, although the conventional structures are effective for reducing crosstalk noise, they have almost no effect of reducing reflection noise on a substrate having a high wire density. In this way, the conventional structures are disadvantageous because their simultaneous reduction of reflection noise and crosstalk noise is minimal.

In the conventional structure shown in FIG. 2, the returning signal is generated through the ground electrodes 14a and 14b positioned on the upper and lower surfaces of the GGFL 12. It is assumed that the high frequency signal is transmitted from the left to the right as shown by the arrow 16 and the returning signal is transmitted from the right to the left as shown by the arrow 17.

In this case, closed loops as shown by the dotted line arrows 18a and 18b are formed along the ground electrodes 14a and 14b positioned on the upper and lower surfaces of the GGFL 12 and the via holes connecting the upper and lower ground electrodes 14a and 14b, and hence, induces radiation noise.

As for reflection noise, the reason why it occurs is that capacitance C is caused due to the capacitive coupling between the ground line and the signal line, resulting in the characteristic impedance mismatching. To decrease reflection noise, the ground line should be designed to be spaced apart from the signal line by a predetermined interval. However, the structure thus designed does not exhibit the effect of a ground line to shield against crosstalk noise. That is, when the wire density is increased, reflection noise is increased again by the ground line that shields against crosstalk noise.

As for the transmission signal returning line formed on the GGFL 12, if the closed loop is formed by the GGFL 12, the ground electrodes 14a and 14b and the via holes 13, it induces radiation noise. However, in the conventional GGFL structure, when the signal lines are disposed to be adjacent to each other to shield against crosstalk noise, radiation noise is further strengthened on the GGFL 12, thereby decreasing the reliability of signal transmission.

With an increase in wire density, reflection noise, crosstalk noise and radiation noise should be considered at the same time. Among the three kinds of noise, if priority is given only to any one kind of noise, the other kinds of noise are inevitably generated. Thus, it is difficult to design an appropriate wire pattern.

In this regard, attempts to dispose GGFLs between signal transmission lines as a microstrip line on a PCB to remove crosstalk noise have been made, and are reported in "Effect Of Ground Guard Fence With Via And Ground Slot On Radiated Emission In Multi-Layer Digital Printed Circuit Board", IEEE International Symposium On Electromagnetic Compatibility, 2001, pp. 653-656. Although the above method may reduce crosstalk noise, reflection noise and radiation noise still remain, or increase, thus worsening the overall noise properties of the PCB. It is impossible to solve the noise problems of PCBs using the above method.

SUMMARY OF THE INVENTION

Accordingly, the present invention has been made keeping in mind the above problems occurring in the related art, and an object of the present invention is to provide a PCB for high frequency signal transmission having reduced noise, by improving a conventional GGFL structure.

Another object of the present invention is to provide a PCB for high frequency signal transmission, capable of minimizing reflection noise and radiation noise, as well as crosstalk noise.

A further object of the present invention is to provide a PCB able to minimize the overall noise properties in consideration of the relationship between various kinds of noise generated on the PCB.

In order to accomplish the above objects, the present invention provides a PCB for high frequency signal transmission, which includes a plurality of transmission lines patterned in a PCB to transmit a high frequency signal; a plurality of ground line blocks disposed between the transmission lines and spaced apart from each other by a predetermined interval in the direction of signal transmission to shield against noise, each of which includes a via hole; and ground electrodes connected to the ground line block by means of the via holes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, a detailed description will be given of the present invention, with reference to the appended drawings.

Figure 3:
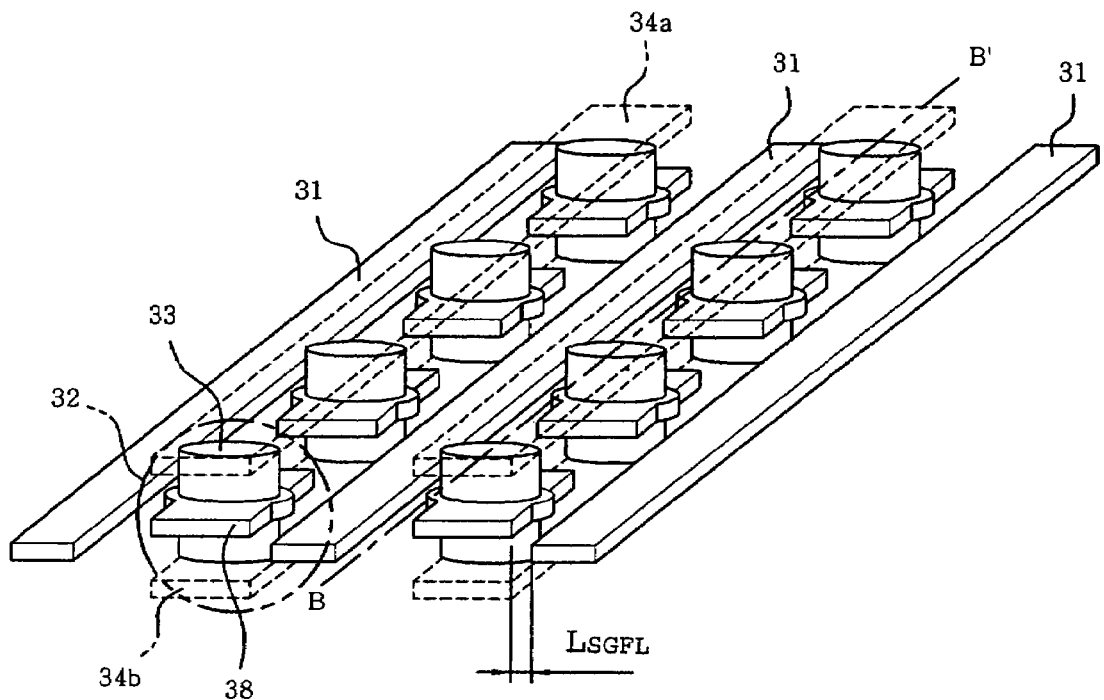
FIG. 3 is a perspective view showing the structure of a PCB for high frequency signal transmission according to the present invention.
Figure 4:
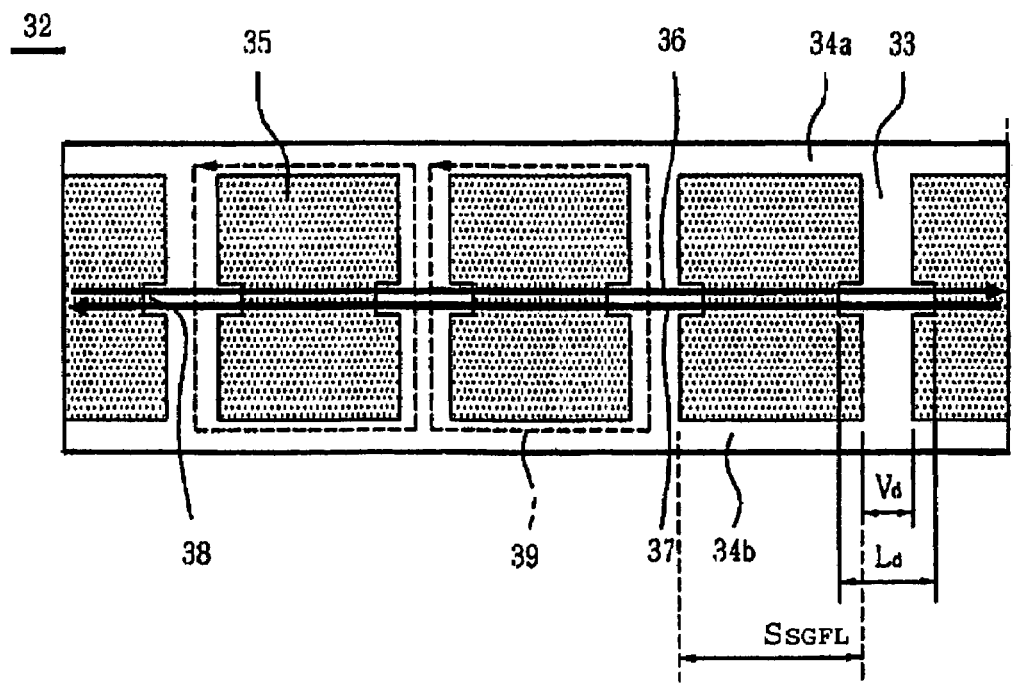
FIG. 4 is a sectional view taken along the line B-B' of FIG. 3.

FIG. 3 is a perspective view showing a PCB for high frequency signal transmission according to the present invention, and FIG. 4 is a sectional view taken along the line B-B' of FIG. 3, which shows ground line blocks 32, via holes 33 and ground electrodes 34a and 34b.

As shown in FIG. 3, the PCB for high frequency signal transmission of the present invention is a multilayer PCB, one layer of which includes a plurality of signal transmission lines 31 to transmit a high frequency signal, and a plurality of ground line blocks 32 disposed between the signal transmission lines 31 to shield against noise. The ground line blocks 32 each have a via hole 33 formed therethrough. In addition, the ground line block 32 may include a land part 38 for connection to the via hole 33.

On the upper and lower surfaces of the ground line blocks 32, the ground electrodes 34a and 34b are formed. The ground line block 32 is connected to the ground electrodes 34a and 34b by means of the via hole 33. The ground electrodes 34a and 34b function to absorb noise to transfer the absorbed noise to a ground terminal, thereby removing noise.

The signal transmission line 31 and the ground line block 32 are formed on the same layer of the PCB, and the ground electrodes 34a and 34b are formed on different layers immediately above and below the above-mentioned layer.

Figure 1:
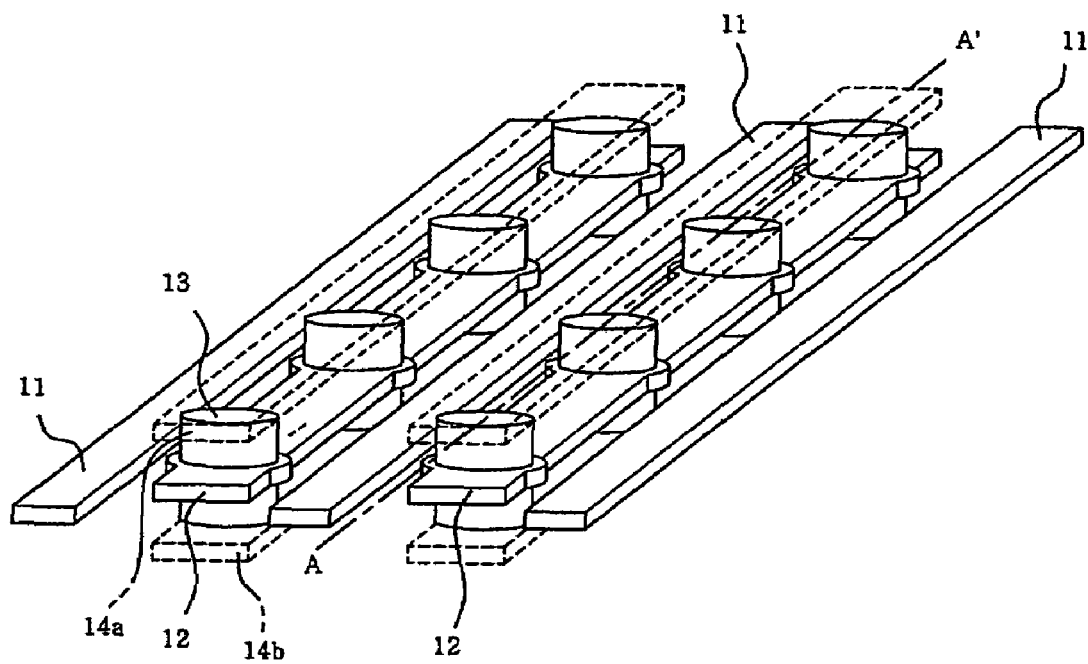
FIG. 1 is a perspective view showing a conventional high density wire structure for use in minimizing noise on a signal line.
Figure 2:
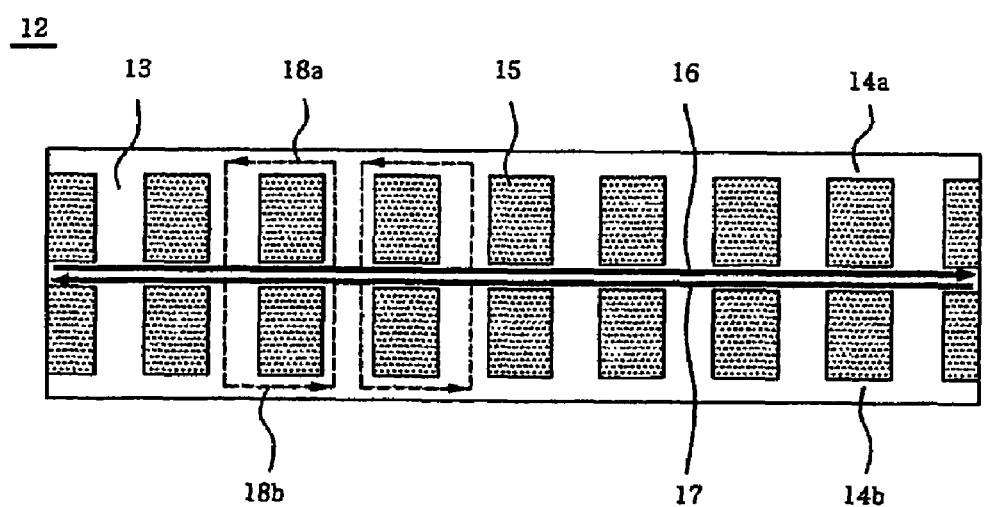
FIG. 2 is a sectional view taken along the line A-A' of FIG. 1.

As shown in FIGS. 3 and 4, the PCB for high frequency signal transmission is structured in such a way that a GGFL 12 of a conventional high frequency signal transmission line shown in FIGS. 1 and 2 is separated into a plurality of ground line blocks 32 that are spaced apart from each other by a predetermined interval ($S_{SGFL}$).

In the PCB of the present invention, the interval ($S_{SGFL}$) between the ground line blocks 32 is preferably represented by Equation 1, below, depending on the experimental results:

$$S_{SGFL} = c/37 \cdot F_{max} \text{(mm)} \qquad \text{Equation 1}$$

Wherein c is $2.998 \times 10^{11}$ mm/sec that is a light speed; $F_{max}$ is 5 times as large as an operation frequency when the transmitted signal is a digital signal, and is equal to the operation frequency of the transmitted signal when such a transmitted signal is an RF; and 37 is the relative dielectric constant of an insulating layer.

$L_{SGFL}$, which is the distance between the signal transmission line 31 and the ground line block 32, is preferably represented by Equation 2, below:

$$L_{SGFL} = a \times \exp(-b^* F_{max}) \qquad \text{Equation 2}$$

wherein a and b are represented by Equation 3, below:

$$a = 0.0125 F_{max}^4 - 0.175 F_{max}^3 + 0.8875 F_{max}^2 + 2.025 F_{max} + 3.7$$

$$b = 00017 F_{max}^4 - 0.0079 F_{max}^3 - 0.0495 F_{max}^2 + 0.856 F_{max} \qquad \text{Equation 3}$$

When the width of the land part 38 of the ground line block 32 is $L_d$ and the diameter of the via hole 33 is $V_d$, the width $L_d$ of the land part 38 is preferably formed to be 0.2 mm larger than the diameter $V_d$ of the via hole 33 to minimize noise, which is represented by Equation 4, below:

$$L_d = V_d + 0.2 \text{ (mm)} \qquad \text{Equation 4}$$

As such, the range of $L_d$ is represented by Equation 5, below:

$$L_d \leq L_{SGFL} \left( \frac{S_{SGFL}}{2} \right) \qquad \text{Equation 5}$$

In FIG. 4, it is assumed that the high frequency signal is transmitted from the left to the right as shown by the arrow 36, and the returning signal is transmitted from the right to the left as shown by the arrow 37.

In this case, a closed loop is formed along the ground electrodes 34a and 34b positioned on upper and lower surfaces of the ground line block 32 and the via holes 33 as shown by the dotted line 39 indicating transmission of the returning signal. However, since the returning line is formed only on the ground electrodes 34a and 34b of upper and lower surfaces of the ground line block 32 and is not formed on the ground line block 32, unlike a conventional transmission line, the number of closed loops formed on the returning line is decreased. As a result, radiation noise that is caused by the closed loop formed in the transmission line of the present invention is almost nil, compared to the conventional structure shown in FIGS. 1 and 2.

Further, the spaces among the signal transmission line 31, the ground line block 32, and the ground electrodes 34a and 34b are filled with a prepreg 35 serving as an interlayer insulating layer of the PCB. Since the spaces among the signal transmission line 31, the ground line block 32, and the ground electrodes 34a and 34b, which are conductors, are filled with the prepreg 35, which is an insulator, the PCB has the same effect as several capacitors arranged in a line.

As such, capacitance C formed between the signal transmission line 31 and the ground line block 32 is represented by Equation 6, below:

$$C = \varepsilon \cdot \frac{A}{d} \qquad \text{Equation 6}$$

Wherein $\in$ is the dielectric constant of the insulating layer 35, A is the area of the ground electrodes 34a and 34b, corresponding to the intervals between the ground line blocks 32, and d is the distance between the ground electrodes 34a and 34b.

As such, the distance d between the ground electrodes 34a and 34b of the present invention is twice as large as the distance d between the ground electrodes 14a and 14b and the GGFL 12 in the conventional transmission line shown in FIGS. 1 and 2. Thus, in the present invention, capacitance C, resulting from the ground line block 32 and the insulator 35, is about ½ times to that of the prior art.

$Z_o$, which is characteristic impedance of a transmission line, is represented by Equation 7, below:

$$Z_o = \sqrt{\frac{R + j\omega L}{G + j\omega C}} \qquad \text{Equation 7}$$

Wherein R is resistance per unit length of a transmission line, L is inductance per unit length of a transmission line, G is conductance per unit length of a transmission line, and C is capacitance per unit length of a transmission line.

Typically, the terminating resistance of a transmission line of 50Ω is the most widely used. The terminating resistance of a conventional signal transmission line shown in FIGS. 1 and 2 does not reach 50Ω, thus generating reflection noise due to impedance mismatching. However, capacitance C of the PCB for signal transmission of the present invention decreases, whereby the characteristic impedance is increased to such an extent that it is closer to 50 Ω. Therefore, reflection noise caused by impedance mismatching is drastically reduced in the present invention.

Table 1, below, shows noise generation and reduction rates of the structure of the present invention, the conventional structure shown in FIGS. 1 and 2, and the transmission line without the GGFL, measured by simulation. As shown in Table 1, in the present invention, reflection noise and radiation noise are confirmed to be further reduced while crosstalk noise is almost unchanged, compared to the conventional GGFL structure.

TABLE 1

| | | Measurement Voltage (V) | | | Improvement (%) | |
|---|---|---|---|---|---|---|
| | Mode | Convent. | Invent. | Without GGFL | Convent. | Invent. |
| Near-end Crosstalk Noise | Even | 0.0184 | 0.0130 | 0.0473 | 61.12 | 72.6 |
| | Odd | 0.0173 | 0.0127 | 0.0491 | 64.78 | 74.2 |
| Far-end Crosstalk Noise | Even | 0.0750 | 0.0551 | 0.8602 | 91.28 | 93.6 |
| | Odd | 0.0722 | 0.0546 | 0.7857 | 90.81 | 93.0 |
| Reflection Noise | | 0.4600 | 0.2198 | 0.2158 | −113.1 | −1.82 |
| Radiation Noise | | 0.07 | 0.01 | 0.05 | −40.0 | 80 |

As described above, the present invention provides a high frequency signal transmission line having reduced noise. In the high frequency transmission line of the present invention, a GGFL is separated into a plurality of ground line blocks that are spaced apart from each other by a predetermined interval, and thus, capacitance between the GGFL and the signal transmission line decreases. Thereby, reflection noise can be minimized while reducing crosstalk noise.

In the high frequency transmission line of the present invention, a GGFL is separated into a plurality of ground line blocks that are spaced apart from each other by a predetermined interval, and thus, the number of closed loops formed on the GGFL decreases. Thereby, radiation noise caused by the closed loop can be minimized while reducing crosstalk noise.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board for high frequency signal transmission, comprising:
    a plurality of transmission lines patterned on a printed circuit board to transmit a high frequency signal;
    a plurality of ground line blocks disposed between the transmission lines and separated from each other with a predetermined interval in a signal transmission direction to reduce noise, wherein each ground line block has a via hole; and
    ground electrodes connected to the ground line block by the via hole.

2. The printed circuit board as set forth in claim 1, wherein the ground electrodes are formed on different layers than the plurality of transmission lines and the plurality of ground line blocks.

3. The printed circuit board as set forth in claim 1, wherein an insulating layer is disposed among the ground electrodes, the transmission lines, and the ground line blocks.

4. The printed circuit board as set forth in claim 1, wherein the ground line blocks are spaced apart from each other by an interval ($S_{SGFL}$) represented by $$S_{SGFL} = c/37 \cdot F_{max}$$

wherein c is $2.998 \times 10^{11}$ mm/sec that is the speed of light; $F_{max}$ is an operation frequency of a transmitted signal; and 37 is a relative dielectric constant of the insulating layer.

5. The printed circuit board as set forth in claim 4, wherein $F_{max}$ is five times the operation frequency of the transmitted signal when the transmitted signal is a digital signal.

6. The printed circuit board as set forth in claim 4, wherein $F_{max}$ is the operation frequency of the transmitted signal when the transmitted signal is a RF signal.

* * * * *